US008330261B2

(12) United States Patent
Thill

(10) Patent No.: US 8,330,261 B2
(45) Date of Patent: Dec. 11, 2012

(54) METHOD TO MANUFACTURE A SILICON WAFER ELECTRONIC COMPONENT PROTECTED AGAINST THE ATTACKS AND SUCH A COMPONENT

(75) Inventor: Michel Thill, Meudon (FR)

(73) Assignee: Gemalto SA, Meudon (FR)

( * ) Notice: Subject to any disclaimer, the term of this patent is extended or adjusted under 35 U.S.C. 154(b) by 437 days.

(21) Appl. No.: 11/883,701

(22) PCT Filed: Feb. 7, 2006

(86) PCT No.: PCT/IB2006/000229
§ 371 (c)(1),
(2), (4) Date: Jul. 22, 2008

(87) PCT Pub. No.: WO2006/085188
PCT Pub. Date: Aug. 17, 2006

(65) Prior Publication Data
US 2008/0286944 A1    Nov. 20, 2008

(30) Foreign Application Priority Data

Feb. 11, 2005  (EP) .................... 05290316 U

(51) Int. Cl.
H01L 23/02 (2006.01)
H01L 29/66 (2006.01)
H01L 21/70 (2006.01)
H01L 23/34 (2006.01)
H01L 21/82 (2006.01)

(52) U.S. Cl. ........ 257/679; 257/365; 257/369; 257/725; 438/128; 438/130

(58) Field of Classification Search .................. 257/143, 257/679, 725
See application file for complete search history.

(56) References Cited

U.S. PATENT DOCUMENTS

| 5,331,184 | A | * | 7/1994 | Kuwahara | 257/139 |
| 5,369,299 | A | * | 11/1994 | Byrne | 257/638 |
| 5,426,314 | A | * | 6/1995 | Nishizawa et al. | 257/136 |
| 5,994,754 | A | * | 11/1999 | Hayashi et al. | 257/495 |
| 6,100,567 | A | * | 8/2000 | Burr | 257/365 |
| 6,137,142 | A | * | 10/2000 | Burr | 257/349 |

(Continued)

FOREIGN PATENT DOCUMENTS

DE    103 37 256 A1    6/2004

(Continued)

OTHER PUBLICATIONS

International Search Report (English only) for PCT/IB2006/000229 mailed Aug. 8, 2006 (3 pages).

Primary Examiner — N Drew Richards
Assistant Examiner — Michael Jung
(74) Attorney, Agent, or Firm — Osha Liang LLP

(57) ABSTRACT

In general, the invention relates to manufacturing a wafer. The method includes manufacturing a wafer that includes a front side and a back side, thinning the wafer down to a thickness suitable for an intended operation of the wafer, polarizing the substrate wafer from the back side, and cutting the wafer. The wafer is polarized such that an attempt to thin the wafer from the backside results in at least one selected from a group consisting of destruction of the wafer and damage to the wafer.

16 Claims, 3 Drawing Sheets

U.S. PATENT DOCUMENTS

| | | | | |
|---|---|---|---|---|
| 6,139,676 A | * | 10/2000 | Fernandez | 156/765 |
| 6,484,945 B1 | * | 11/2002 | John et al. | 235/487 |
| 7,005,733 B2 | * | 2/2006 | Kommerling et al. | 257/679 |
| 7,577,926 B2 | * | 8/2009 | Bretschneider | 716/1 |
| 2001/0045583 A1 | | 11/2001 | Morishita et al. | |
| 2002/0195600 A1 | * | 12/2002 | Leuschner | 257/40 |
| 2004/0026728 A1 | | 2/2004 | Yoshida et al. | |
| 2004/0164361 A1 | | 8/2004 | Baukus et al. | |
| 2005/0058006 A1 | * | 3/2005 | Noda | 365/232 |
| 2006/0151361 A1 | * | 7/2006 | Launay | 209/569 |
| 2007/0121575 A1 | * | 5/2007 | Savry et al. | 370/351 |

FOREIGN PATENT DOCUMENTS

| | | |
|---|---|---|
| EP | 0 883 184 A2 | 12/1998 |

\* cited by examiner

METHOD TO MANUFACTURE A SILICON WAFER ELECTRONIC COMPONENT PROTECTED AGAINST THE ATTACKS AND SUCH A COMPONENT

BACKGROUND

This invention concerns a method to manufacture an electronic component, including a silicon wafer, usable in particular in smart cards. More particularly, the method aims to protect said component against the attacks designed to determine some of its operating characteristics and obtain some of its secret data, for fraudulent purposes. The invention also concerns such a component so realised.

Silicon wafer components have a front side and a back side. The front side has electronic components usually consisting of CMOS type transistors (N transistor and P transistor), comprising body ties or wells of N+ or P+ doped materials, to polarise the P-substrate and the N-moats for transistors with the same doping as the substrate. The thickness of a silicon wafer is usually about 600 to 700 microns, the maximum thickness of the active parts and the moats being about 10 microns.

We know that smart cards contain sensitive information and/or are used as means of communication to access such information. These cards are subject to fraudulent operations known as attacks, by persons trying to obtain this information illegally.

The traditional attacks are currently made from the front side (side supporting the active components). These attacks consist in injecting faults, by light radiation or other, or in sampling information by capture of electromagnetic radiation or other. These faults cause abnormal electronic behaviour of the integrated circuit, such as losses of information in the memories, incorrect memory reads, degradation of logic levels which can be incorrectly interpreted by the logic layers.

Currently therefore, the most frequent and efficient attacks occur on the front side, in a known manner.

The attackers, however, are starting to take an interest in the back side. This side is in fact easier to read (fewer disturbing elements such as the various metallisation layers connecting the transistors together). However, the thick silicon forms an absorbing barrier.

To cross the barrier, the attacks from the back side, in a known manner, consist in significantly thinning the silicon wafer (down to several tens of microns).

Currently, observation and/or disturbance of the component by the back side remains difficult due to the absorption by the silicon, but the thinning methods are making extremely rapid progress and it is clear that this type of attack is likely to become more and more important and the resulting threats will become extremely serious.

In addition, the manufacturers of such circuits need to know their operation, in order to test and/or debug them. These debugging methods lead to progress in the behaviour observation techniques seen from the back side, indirectly contributing to the development of new techniques for the attackers.

The investigation operations, whether as malicious attacks or for testing or debugging purposes, include a step to thin the silicon wafer down to a thickness of less than about 200 microns, or even several tens of microns.

This thinning does not disturb the operation of the circuit or of its components (transistors).

We also know that the silicon substrate must be very highly polarised to avoid destruction (e.g. latch up or malfunctions caused by modified electrical characteristics of the transistors).

Consequently, in a known manner, polarisation connections are planned on the front side of the silicon wafer, as body ties of doped material, to offer a constant level of potential for the substrate and the polarisation moats of the P transistors. Each polarisation connection provides equipotentiality over a radius of about 50 microns, so one polarisation connection can be associated with a group of about 5 to 20 transistors.

For the N transistors, the polarisation connection consists of a P+ doped connection, connected to the potential VSS, of width about 1 micron and depth a few microns. For the P transistors, the polarisation connection consists of a body tie as an N+ doped well polarising the N-moat, which includes the P+ doped body ties forming the transistor. Said body tie forming a polarisation connection is connected to the potential VDD (5 or 3 volts).

SUMMARY

In view of the above, we can see that there is a need to protect smart card components against malicious attacks.

The invention aims to solve the problem of protecting such components and proposes a method to manufacture a silicon wafer-based electronic component (or series of components), applicable in particular in the field of smart cards and which can be used to protect the components against attacks from the back side, including a step to thin the wafer from the back.

According to the invention, therefore, the method to manufacture a component, such as a silicon wafer-based microcontroller, integrated circuit or equivalent, applicable in particular to smart cards, is characterised in that means are planned to destroy or damage said component in the event of an attempt to thin the silicon wafer from the back side.

More precisely, these means can act on the polarisation of said wafer.

According to a preferred form, the method comprises a step to polarise the silicon substrate wafer, from the back side only.

More particularly, the method includes the following steps:
  Test the wafer with a usual or normal substrate polarisation, corresponding to operation, the wafer having its usual thickness;
  Thin the substrate down to a thickness suitable for the intended operation of the component;
  Polarise the substrate from the back side; Cut the corresponding wafer.

More specifically, the step to polarise the substrate from the back side consists in:
  Doping the back side, by a body tie or well, of doped material, forming a back polarisation connection;
  Depositing a layer of conducting material (e.g. metal) on the back side;
  Cutting the wafer; and
  Conditioning the component, with the back side connected to the ground.

Advantageously, the wafer is cut so that as to disconnect the front point of polarisation. Consequently, any future thinning for malicious purposes will remove the polarisation of the wafer, thereby destroying said component.

For a circuit composed of CMOS transistors, the back polarisation connections consist of P+ doped body ties. Any future thinning for fraudulent purposes will therefore remove the polarisation of the substrate and destroy the circuit on power up.

Nevertheless, the attackers have a device to get round this method, which consists in remetallising the back side before powering up the circuit.

To block this device used by the attackers, an improved version of the method of the invention consists in inserting decoys (or extra body ties) in electrical contact with the moats of the P transistors. These decoys consist of N+ doped body ties connecting the back side to the bottom of the usual polarisation moat, located on the front side. In addition, a disc of insulating material is placed between said decoys and the back conducting layer.

Consequently, during a fraudulent attack attempt, after thinning the silicon wafer the future remetallising step (deposition of a new layer of metal) will connect the back polarisation connections with the decoys, which are electrically opposite, thereby provoking a short circuit which will destroy the components.

The invention also concerns a silicon wafer electronic component, such as a microcontroller, applicable in particular to smart cards, of the type including elements such as transistors or equivalent, characterised in that it includes means to destroy or damage said component in the event of an attempt to thin the silicon wafer from the back side.

More precisely, these means can act on the polarisation of said wafer.

Specifically, the component includes, for each element or transistor or equivalent, a back polarisation connection, to polarise the silicon substrate from the back side only.

According to a preferred mode, the back polarisation connection consists of a body tie of doped material.

In addition, the silicon wafer includes a layer of conducting material (e.g. metal) on the back side, connected in use to the potential VSS.

The invention also concerns a smart card including at least one silicon wafer-based component, produced using the method described, and at least one silicon wafer component as described.

DESCRIPTION OF DRAWINGS

The invention will be clearly understood on reading the following description referring to examples of implementation of the invention, and using the attached drawings in which.

DETAILED DESCRIPTION

Figure 1:
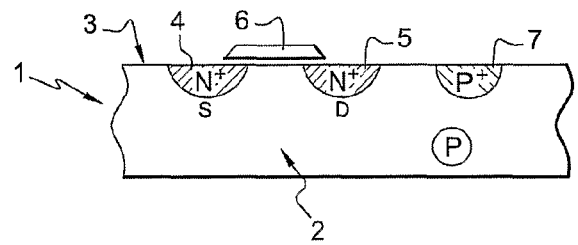
FIG. 1 is a cross-section, in large scale, of a known type of silicon wafer, including an N transistor.
Figure 2:
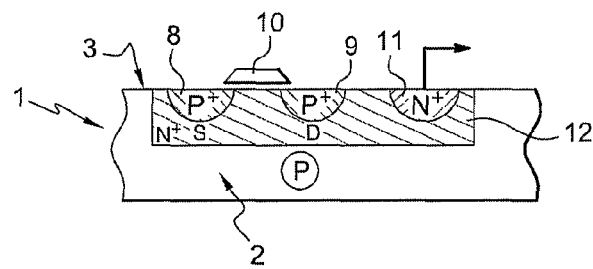
FIG. 2 is a cross-section of another part of the known type of silicon wafer shown on FIG. 1, including a P transistor.

FIGS. 1 and 2 above represent a silicon wafer and components of known type

FIG. 1 shows a silicon wafer 1, at very large scale, although the relative proportions have not been respected for practical purposes and greater understanding. Said wafer 1 includes a silicon substrate 2 (P), with on its front side 3 an electronic component of type N transistor, including a source S referenced 4, and a drain D referenced 5, as respective body ties of N+ doped material, associated with the polysilicon gate of transistor 6.

FIG. 1 also shows a body tie 7, forming a polarisation connection of the substrate.

The silicon substrate 2 of the wafer 1 requires, in a known manner, high polarisation to prevent the electronic component, in this case the N transistor shown on the example of FIG. 1, from latching up.

The polarisation connection 7 consists of a body tie of P+ doped material of dimension about one micron in cross-section. This polarisation connection is connected to the ground (0 volt), and therefore provides equipotentiality of the substrate over a radius of about 50 microns. Considering the dimensions of CMOS transistors, one polarisation connection, like connection 7, is required for every 5 to 20 transistors.

FIG. 2 shows a partial cross-section of another part of the silicon wafer 1 of FIG. 1, of known type, and including the same substrate 2 of silicon (P), and whose front side 3 is associated with a P transistor. The latter has a source S, referenced 8, and a drain D referenced 9, consisting of body ties of P+ doped material. The transistor gate 10 is also planned between the source 8 and the drain 9 on the front side 3.

To ensure that the transistor operates correctly, it must be insulated from the substrate P. In a known manner, an N-moat 12 is therefore provided, polarised to potential VDD by an N+ polarisation well 11 inserted on the front side 3.

Examples of forms of realisation of the invention are described below, in reference to FIGS. 3 to 7.

Figure 3:
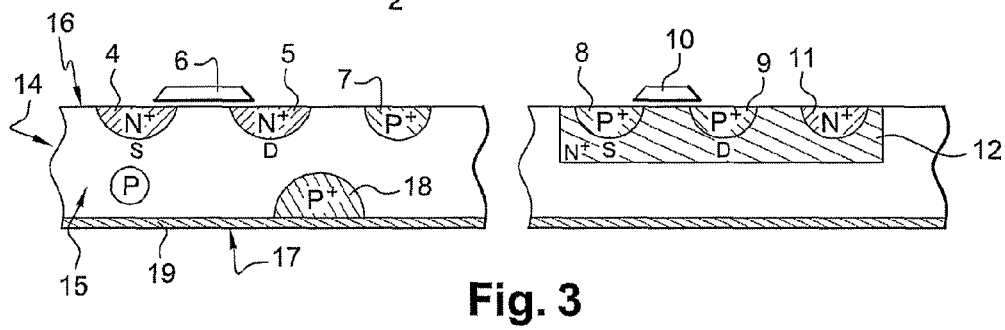
FIG. 3 is a cross-section of a silicon wafer according to a "basic" version of the invention, showing an N transistor and a P transistor.

FIG. 3 represents a partial cross-section of a silicon wafer 14 on which an N transistor and a P transistor are shown on the left and right of the figure, respectively.

The wafer 14 includes a silicon substrate 15 which has on its front side 16 a known N transistor as described on FIG. 1. The N transistor includes the source S referenced 4, the drain D referenced 5 and the poly silicon gate 6, the drain 5 and the source 4 consisting of N+ doped material. The polarisation connection 7, as a P+ doped body tie, is also shown.

On the front side of the silicon wafer 14, there is also a P transistor (of known type) with its source 8 and drain 9, polysilicon gate 10, N+ doped polarisation moat 12, and the well 11 (N+ doped) for the voltage connection VDD (3 to 5 volts).

According to the invention, the back side 17 of the substrate 14 includes a body tie 18 of P+ doped material, which forms a back polarisation connection, whose operation is described below. The cross-section dimension of the body tie 18 is about 10 microns.

After creating the body tie 18 forming the back polarisation connection, the back side 17 of the substrate 15 is covered with a layer 19 of electrically conducting material, such as metal, connected to the ground (0 volt).

Figure 4:
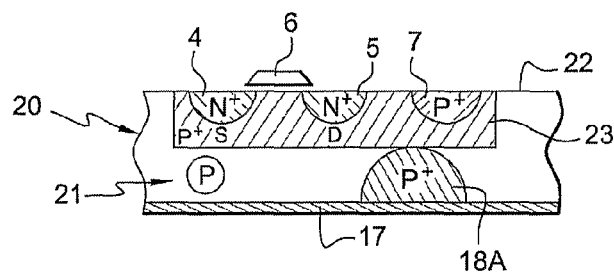
FIG. 4 is a cross-section of a silicon wafer according to the invention, including an N transistor, of the double moat type.

The invention also applies to wafers comprising so-called double moat N transistors, as shown on FIG. 4.

FIG. 4 represents a diagrammatic cross-section of a silicon wafer 20 including a silicon substrate 21, with on its front side 22 a so-called "double moat" CMOS N transistor of known type. Said transistor includes a source S, referenced 4, a drain D referenced 5, both as N+ doped body-ties and a polarisation connection 7 as a P+ doped body tie and a poly silicon gate 6, connecting the source and the drain. The source, the drain and the polarisation connection 7 are inserted in a moat 23, of P+ doped material. According to the invention, and referring to the form of realisation of FIG. 3, a back polarisation connection, as a P+ doped body tie 18A, is inserted on the back side of the silicon substrate 21. The back polarisation body tie 18A is in contact with the base of the moat 23. As with the form of realisation of FIG. 3, a metallisation layer 17 is planned on the back side, thereby also covering the back polarisation connection 18A.

An improved variant of the invention is described below, in reference to FIG. 5.

Figure 5:
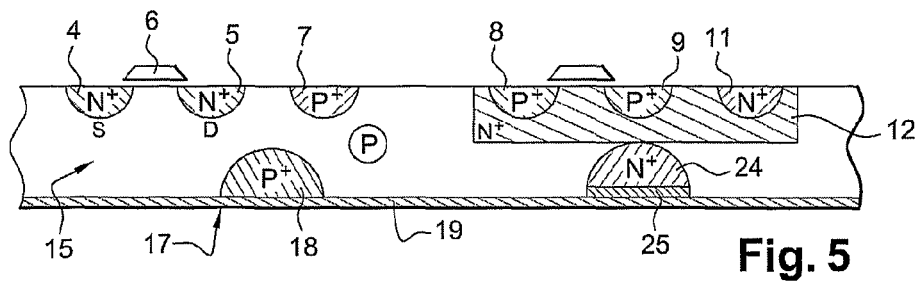
FIG. 5 is a cross-section of a silicon wafer according to an improved variant of the invention.

FIG. 5 shows the silicon wafer 14 of FIG. 3 equipped with the silicon substrate 15 with on its front side 16 a P transistor and an N transistor. On FIGS. 3 and 5, elements which are similar or identical have the same reference numbers. The figures show the components of the N and P transistors respectively and the back polarisation connection (P+ doped) described above.

According to the improved variant of the invention, the silicon substrate 15 is equipped, on its back side, with extra body ties 24 doped with N+ material, of size such that they are in contact with the base (facing towards the back side of the wafer 15) of the moat 12 (itself N+ doped) of the corresponding P transistor.

Figure 8:
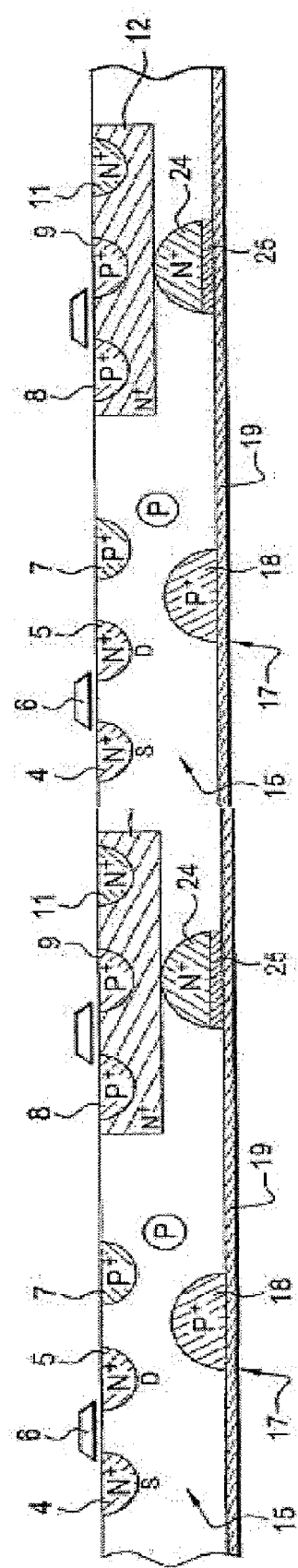
FIG. 8 is a cross-section of a silicon wafer according to an improved variant of the invention.

These extra body ties 24 form decoys, as shown in FIG. 8 and as explained below.

The N+ doped material of the extra body tie 24 (decoy) does not take up all the space formed by the body tie, but leaves some, a few hundred Angstrom units thick, so that the N+ doped material does not extend to the back side of the substrate. Said space is filled with a layer or disc 25 of electrically insulating material level with the back side.

The back side of the substrate 15 is covered with a layer 19 of electrically conducting material such as metal. The decoy or back polarisation connection 24 (N+ doped) is therefore electrically insulated from the back metallic layer 19 by the disc 25 of insulating material.

In this variant of realisation, the malicious attempt, which consists in reducing the thickness and in then remetallising the back side is certain to fail.

Remetallising, by depositing a new metallisation layer, after thinning, electrically connects (see FIG. 5) the back polarisation body tie 18 (P+) and the decoy or extra body tie 24 (N+). The resulting short circuit will destroy the component.

Figure 6:
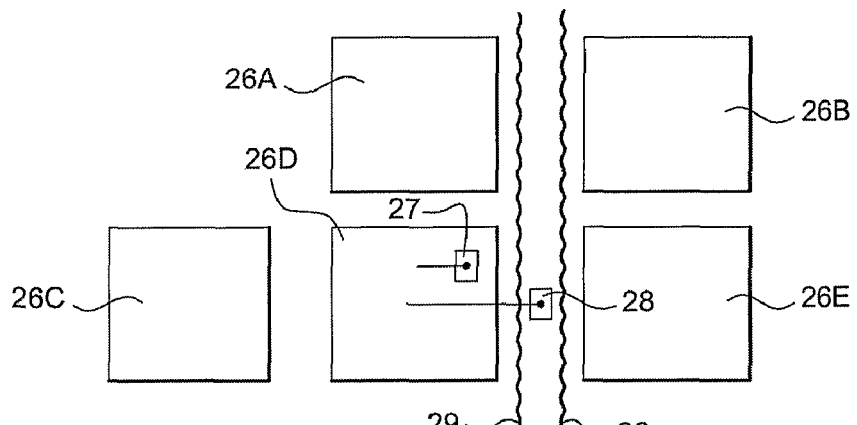
FIG. 6 is a diagrammatic plan view of a set of adjacent wafers, according to the invention.

FIG. 6 shows diagrammatically a series of CMOS electronic components 26A, 26B, 26C, 26D and 26E (obviously, N transistors together with all other similar components are also applicable to the invention). The components 26A to 26E are shown contiguous and/or aligned in rows and columns, and symbolically represented by squares.

For clarity reasons, only electronic component 26D shows a stud 27 which will be connected to an operating potential Vss and a stud 28 connected to the front polarisation connections (references 7 and 11 of FIG. 3) of the component. The back polarisation connections corresponding to the body ties 18 of FIGS. 3 (and 18A of FIG. 4) are not visible but are connected to the metallisation layer 17 planned on the back side. The extra body ties or decoys 24 of FIG. 5 and FIG. 8 are not connected to the exterior.

On FIG. 6 two wavy lines symbolise two alternative ways in which the wafer could be cut to obtain a set of circuits.

According to a first form of realisation of the invention, the wafer is cut along line 29 so as to delete the stud 28 connected to the front polarisation, or to insulate it from the corresponding wafer or component.

We can understand, in reference to FIGS. 3 and 4, that during an attack, any future reduction in the substrate thickness from the back side will eliminate the connection to VSS of the body tie 18 (the back polarisation connection) and remove the insulation of the body ties. This thinning therefore results in: the disappearance of the substrate polarisation for the basic version of the invention in reference to FIGS. 3 and FIG. 4 (double moat P transistor);—a short circuit between the substrate and the N moat 12, in the so-called improved version (FIG. 5).

According to another form of implementation of the method of the invention (on the basis of the wafer shown on FIG. 5), the wafer is cut along line 30 (FIG. 6), i.e. leaving the front polarisation stud 27 connected.

In this case, the same circuit can be used in the normal way, without carrying out the additional back side steps, by connecting the studs 27 and 28 to the potential VSS, during use.

This means that the same circuit can be used either with the additional back side polarisation steps, or without these steps, depending on whether or not the front side polarisation stud is to be kept, and depending on how the wafer is cut.

Figure 7:
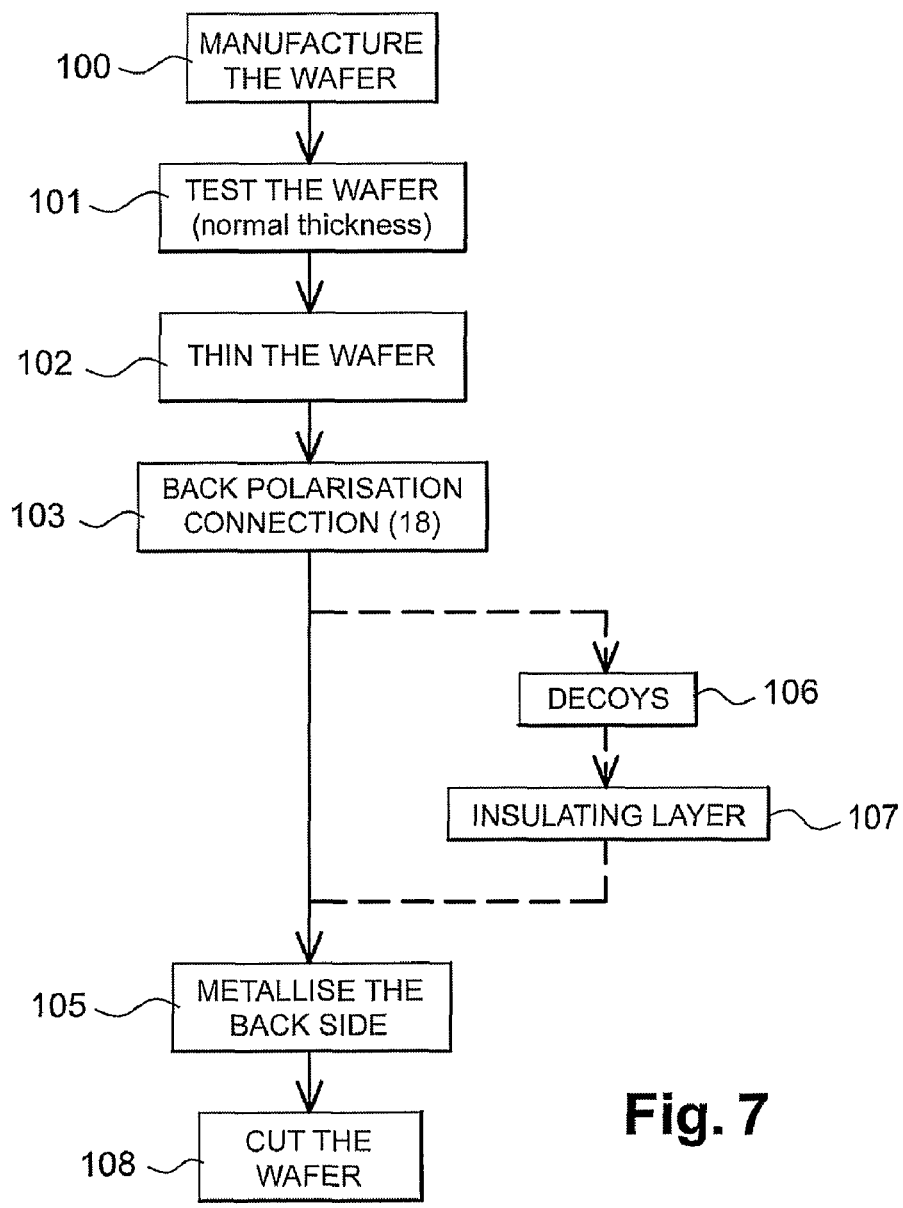
FIG. 7 is a block diagram of the steps in the method of the invention.

FIG. 7 shows a flowchart of the various steps of the method according to the invention.

Initially, the wafer is manufactured in a known manner (functional block 100).

In a second step (block 101), tests are carried out on the wafer produced, with a normal thickness. The wafer is then thinned (block 102) down to a few tens of microns.

A body tie is then created (block 103), on the back side, forming a back polarisation connection (reference 18 on FIGS. 3, 4 and 5).

According to the so-called improved variant of the invention (FIG. 5), before the next step (105) to metallise the back side, two additional steps are planned, connected by dotted lines to the other functional blocks:

insertion (block 106) of decoys or extra body ties (N+ doped), referenced 24 on FIG. 5; and deposit (block 108) of an electrically insulating disc 25.

The back side is then metallized (block 105) (FIGS. 3, 4 and 5).

Lastly, the wafer is cut (block 108). The wafer can either be cut, as indicated in relation to the description of FIG. 6, so as to either leave the polarisation stud 28 connected (cutting line 30), or to delete or disconnect it (cutting line 29).

The invention claimed is:

1. A smart card including at least a silicon wafer component comprising:
   a front side comprising a plurality of transistors,
   a back side comprising:
      a back side substrate comprising a decoy, a body tie of doped material and a well of doped material;
      means for causing a short circuit in the plurality of transistors when the silicon wafer component is thinned from the back side and subsequently remetallized on the back side, the remetallization operatively connects the body tie with the decoy, resulting in the short circuit,
   wherein the means comprises at least one selected form a group consisting of the body tie and the well.

2. An electronic wafer based component comprising:
   a front side comprising an active part of the electronic wafer based component, the active part comprising a plurality of transistors;
   a back side comprising:
      a back side substrate comprising a decoy, a body tie of doped material and a well of doped material;

a means for causing at least one selected from a group consisting of destroying the electronic wafer based component and damaging the electronic wafer based component when the electronic wafer based component is thinned from the back side and subsequently remetallized on the back side, the remetallization operatively connects the body tie with the decoy, resulting in a short circuit in the plurality of transistors, wherein the means comprise at least one selected form a group consisting of the body tie and the well.

3. The electronic wafer based component of claim 2, wherein the means is configured to act on the polarization of the electronic wafer based component.

4. The electronic wafer based component of claim 2, wherein at least one of the plurality of transistors is one selected from a group consisting a CMOS type transistor and a NMOS type transistor, and wherein the CMOS type transistor and the NMOS type transistor comprises at least one selected from a group consisting of substrate technology, substate and N moat technology, and double moat technology.

5. The electronic wafer based component of claim 2,
wherein the electronic wafer based component comprises a back polarization connection for each of the plurality of transistors,
wherein the back polarization connections comprise the at least one selected from a group consisting of the body tie of doped material and the well of doped material, and
wherein the back polarization connections are configured to only polarize the back side of the electronic wafer based component.

6. The electronic wafer based component of claim 2, wherein the back side comprises a covering of a layer of conducting material.

7. The electronic wafer based component of claim 2, wherein the back side of the electronic wafer based component comprises a plurality of decoys arranged in a substantially regular distribution across the back side, wherein each decoy of the plurality of decoys is in electrical contact with a base of a moat of a P transistor.

8. The electronic wafer based component of claim 7, wherein each decoy of the plurality of decoys is insulated, from a back metallisation layer, by a layer of electrically insulating material.

9. An electronic wafer based component comprising:
a front side comprising a plurality of transistors, and
a back side comprising:
  a first body tie;
  a second body tie, wherein the second body tie is operatively connected to at least a portion of the plurality of transistors;
  a metallization layer exposed on the back side and covering the first body tie and the second body tie; and
  a layer of insulating material interposed between the second body tie and the metallization layer, and
wherein when the electronic wafer base component is thinned from the back side and remetallized on the back side, the remetallization operatively connects the first body tie with the second body tie, resulting in a short circuit in the plurality of transistors.

10. A method to manufacture a wafer, comprising:
manufacturing the wafer comprising a front side and a back side, wherein the front side comprises an active part of the wafer, wherein the back side comprises a back side substrate comprising a decoy;
thinning the wafer to a specified thickness; and
polarizing the wafer from the back side by creating, in the back side substrate, a back polarization connection,
wherein the back polarization connection comprises at least one selected from a group consisting of a body tie of doped material and a well of doped material,
wherein the back side is configured to cause at least one selected from a group consisting of destruction of the wafer and damage to the wafer when the wafer is thinned from the back side and subsequently remetallized on the back side, the remetallization operatively connects the body tie with the decoy, resulting in a short circuit within the wafer; and
cutting the wafer.

11. The method of claim 10, wherein polarizing the wafer comprises:
depositing a layer of conducting material on the back side over the back polarized connection.

12. The method of claim 11, wherein cutting the wafer comprises maintaining a connection between the back polarization connection and a circuit.

13. The method of claim 11, wherein prior to depositing the layer of conductive material, at least one selected from a group consisting of an extra body tie and a decoy is inserted on the back side of the wafer.

14. The method of claim 11, wherein prior to depositing the layer of conductive material, an extra body tie and a decoy are inserted on the back side of the wafer.

15. The method of claim 10, wherein cutting the wafer comprises disconnecting a front polarization connection of the wafer.

16. The method of claim 10, wherein only the back side of the wafer is polarized.

* * * * *

UNITED STATES PATENT AND TRADEMARK OFFICE
CERTIFICATE OF CORRECTION

| | | |
|---|---|---|
| PATENT NO. | : 8,330,261 B2 | Page 1 of 1 |
| APPLICATION NO. | : 11/883701 | |
| DATED | : December 11, 2012 | |
| INVENTOR(S) | : Michel Thill | |

It is certified that error appears in the above-identified patent and that said Letters Patent is hereby corrected as shown below:

On the cover page, under (30) Foreign Application Priority Data, letters patent lists the application number as "05290316 U" and it should be -- 05290316.8 --.

Signed and Sealed this
Nineteenth Day of February, 2013

Teresa Stanek Rea
*Acting Director of the United States Patent and Trademark Office*